United States Patent
Kannengiesser et al.

(10) Patent No.: US 10,401,454 B2
(45) Date of Patent: Sep. 3, 2019

(54) METHOD AND APPARATUS ASSIGNMENT OF A SPIN SPECIES TO A COMBINATION IMAGE

(71) Applicant: Siemens Healthcare GmbH, Erlangen (DE)

(72) Inventors: Stephan Kannengiesser, Wuppertal (DE); Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 176 days.

(21) Appl. No.: 15/272,623

(22) Filed: Sep. 22, 2016

(65) Prior Publication Data
US 2017/0082712 A1  Mar. 23, 2017

(30) Foreign Application Priority Data
Sep. 22, 2015  (DE) .......... 10 2015 218 165

(51) Int. Cl.
*G01R 33/48*  (2006.01)
*G01R 33/56*  (2006.01)

(52) U.S. Cl.
CPC ..... *G01R 33/5608* (2013.01); *G01R 33/4828* (2013.01)

(58) Field of Classification Search
CPC .... G01R 33/48; G01R 33/4828; G01R 33/56; G01R 33/5608
See application file for complete search history.

(56) References Cited

U.S. PATENT DOCUMENTS

| 5,594,336 A * | 1/1997 | Gullapalli | G01R 33/4828 324/309 |
| 6,841,997 B2 * | 1/2005 | Feiweier | G01R 33/4828 324/307 |

(Continued)

OTHER PUBLICATIONS

Ma, "Breath-Hold Water and Fat Imaging Using a Dual-Echo Two-Point Dixon Technique With an Efficient and Robust Phase-Correction Algorithm," Magnetic Resonance in Medicine, vol. 52, pp. 415-419 (2004).

(Continued)

*Primary Examiner* — Son T Le
(74) *Attorney, Agent, or Firm* — Schiff Hardin LLP

(57) ABSTRACT

In a method and apparatus for the automatic assignment of at least one combination image of an examination object to a spin species represented in a combination magnetic resonance (MR) image, an information MR dataset is obtained and evaluated in a computer to determine information about the examination object from the captured information MR dataset. At least two MR datasets are acquired at one of at least two echo times in each case following an excitation by a multi-contrast measurement. At least one combination image is determined from the at least two MR datasets, and spin species represented in the at least one combination image are assigned on the basis of the information determined from the information MR dataset. By using additional information about the examination object determined by MR technology an automatic unambiguous global assignment of the correct spin species is enabled.

8 Claims, 2 Drawing Sheets

(56) References Cited

U.S. PATENT DOCUMENTS

| | | | |
|---|---|---|---|
| 2005/0033151 A1* | 2/2005 | Wu | G01R 33/50 |
| | | | 600/410 |
| 2005/0165296 A1 | 7/2005 | Ma | |
| 2014/0114178 A1 | 4/2014 | Dale | |
| 2014/0350386 A1* | 11/2014 | Eggers | G01R 33/4828 |
| | | | 600/416 |
| 2016/0161584 A1 | 6/2016 | Fautz et al. | |
| 2017/0035321 A1* | 2/2017 | Polimeni | G01R 33/50 |

OTHER PUBLICATIONS

Kanayama et al., "Ultrafast Single-Shot Water and Fat Separated Imaging with Magnetic Field Inhomogeneities," IEICE Trans. Inf. & Syst., vol. E77-D, pp. 918-924 (1994).

Ma et al., "T2-Weighted Spine Imaging With a Fast Three-Point Dixon Technique: Comparison With Chemical Shift Selective Fat Suppression," Journal of Magnetic Resonance Imaging, vol. 20, pp. 1025-1029 (2004).

\* cited by examiner

METHOD AND APPARATUS ASSIGNMENT OF A SPIN SPECIES TO A COMBINATION IMAGE

BACKGROUND OF THE INVENTION

Field of the Invention

The invention concerns a method, a magnetic resonance apparatus and an electronically readable data storage medium for the automatic assignment of a spin species to a combination image that was obtained from at least two magnetic resonance datasets of a multi-contrast measurement.

Description of the Prior Art

Magnetic resonance (MR) technology is a known modality that can be used to generate images of the inside of an examination object. In simple terms, the examination object is positioned in a magnetic resonance scanner in a strong static, homogeneous constant magnetic field, also called a $B_0$ field, with field strengths of 0.2 Tesla to 7 Tesla and more, such that nuclear spins in the object are oriented along the constant magnetic field. To trigger nuclear spin resonances, radio-frequency excitation pulses (RF pulses) are radiated into the examination object, the triggered nuclear spin resonances are measured as so-called k-space data, and on the basis thereof MR images are reconstructed or spectroscopy data are determined. For spatial encoding of the measurement data, rapidly switched magnetic gradient fields are overlaid on the constant magnetic field. The recorded measurement data are digitized and stored in the form of complex numeric values in a k-space matrix. An associated MR image can be reconstructed from the value-filled k-space matrix, for example by a multidimensional Fourier transform.

Various MR techniques are known for separating signals originating from different spin species, for example spin in a water environment and spin in a fat tissue environment as well as other environments, into recorded MR data or for suppressing the signals from particular spin species. These techniques include so-called multi-contrast measurements. One such technique is the Dixon technique, in which at least two MR datasets are recorded at different echo times in each case following an excitation and are therefore recorded with different contrasts. In this case the echo times are selected such that the relative phase position of different spin species of the signals contained in an MR dataset is different in the various recorded MR datasets. With knowledge of the respective phase positions it is possible to extract combination images from the recorded MR datasets reconstructed MR datasets, which, for example, represent signals from only one spin species. The combination images can hence also be designated as parametric maps derived from the MR datasets captured at the different echo times.

In principle, a Dixon technique can be implemented using different sequence types, for example with (turbo) spin echo sequences, SSFP sequences (SSFP: "steady-state free precession") or gradient echo sequences, and it therefore has a wide range of applications.

To determine a combination image the reconstructed MR images are generally set off against one another pixel by pixel. In order to eliminate unknown phase portions, the absolute signal portions of the pixels are for example taken into consideration, which means the results are not unambiguous if a subtraction takes place, since $$|S| = \begin{cases} Sp1 - Sp2; & Sp1 > Sp2 \\ Sp2 - Sp1; & Sp2 > Sp1 \end{cases},$$

where S represents the value of the signal and Sp1 and Sp2 represent the signal components of two different spin species, e.g. water and fatty tissue. Such an ambiguity can occur (e.g. because of $deltaB_0$) even in the case of complex-valued processing of the MR datasets captured at the different echo times.

The most that can be concluded is which combination image represents the dominant spin species, namely the one that is determined by an addition of signals from the at least two captured MR datasets, and which combination image represents the subordinate spin species, namely the one which is determined by subtracting signals from the at least two captured MR datasets. The most frequent application of a Dixon technique is water/fat separation, in which a water image and/or a fat image is to be determined as a combination image.

Likewise, if the derived combination images are determined by optimization, in which there may be several local minima, an ambiguity of this type exists. This is because although all the minima are known, it is not possible to conclude which one is the one sought (in the simplest case the values of the optimization function are identical for all minima—the minima are thus degraded). However, the minima can, as described, be characterized e.g. by the dominant species.

Therefore although the result of a Dixon technique is the combination images noted above, which represent signals from only one spin species, it is not readily apparent which combination image obtained is to be assigned to which spin species. When a fat/water separation is desired, it is not possible to conclude which of the determined combination images is the fat image and which the water image. The correct assignment still has to be selected first.

If several Dixon recordings are taken, so that several sets of MR images of just one spin species are obtained, it can occur that the assignment has taken place differently in the different sets, which means MR images from different sets, which in fact represent the same spin species, are assigned to different spin species.

SUMMARY OF THE INVENTION

An object of the invention is to enable an unambiguous assignment of combination images obtained by the use of a multi-contrast measurement to the correct spin species in each case.

The inventive method for the automatic assignment of at least one combination image of an examination object to a spin species represented in the combination image has the following steps.

An information MR dataset is acquired and provided to a computer wherein information about the examination object is determined from the captured information MR dataset.

At least two MR datasets are acquired at one of at least two echo times in each case following excitation by a multi-contrast measurement.

At least one combination image is determined in the computer from the at least two MR datasets.

The spin species represented in the at least one combination image is assigned in the computer on the basis of the information determined from the information MR dataset, and an electronic signal designating the assignment is provided from the computer.

By using additional information about the examination object determined by magnetic resonance technology, the method enables an automatic unambiguous global assignment of the correct spin species. The information MR dataset can be acquired without great effort. In particular, a so-called "adjustment scan," which is required in any case, e.g. to determine parameters to be set during the measurement, can be used as the information MR dataset. Because the determined information can be obtained directly from the examination object also represented in the combination image, a particularly good congruence exists, which has a positive impact on the accuracy of the method.

In an exemplary embodiment, the information determined from the information MR dataset is also used in the context of determining the at least one combination image. Advantageously, possible locally occurring interchanges of the spin species identified as dominant can additionally be avoided hereby.

An inventive magnetic resonance system has a scanner with a basic field magnet, a gradient coil arrangement, a radio frequency antenna and a control computer designed to perform the inventive method.

An inventive electronically readable data storage medium is encoded with electronically readable control information (program code), which is configured to cause a control computer of a magnetic resonance apparatus, in which the storage medium is loaded, to perform the inventive method.

The advantages and details described above in relation to the method also apply to the magnetic resonance apparatus, and the electronically readable data carrier.

DESCRIPTION OF THE PREFERRED EMBODIMENTS

Figure 1:
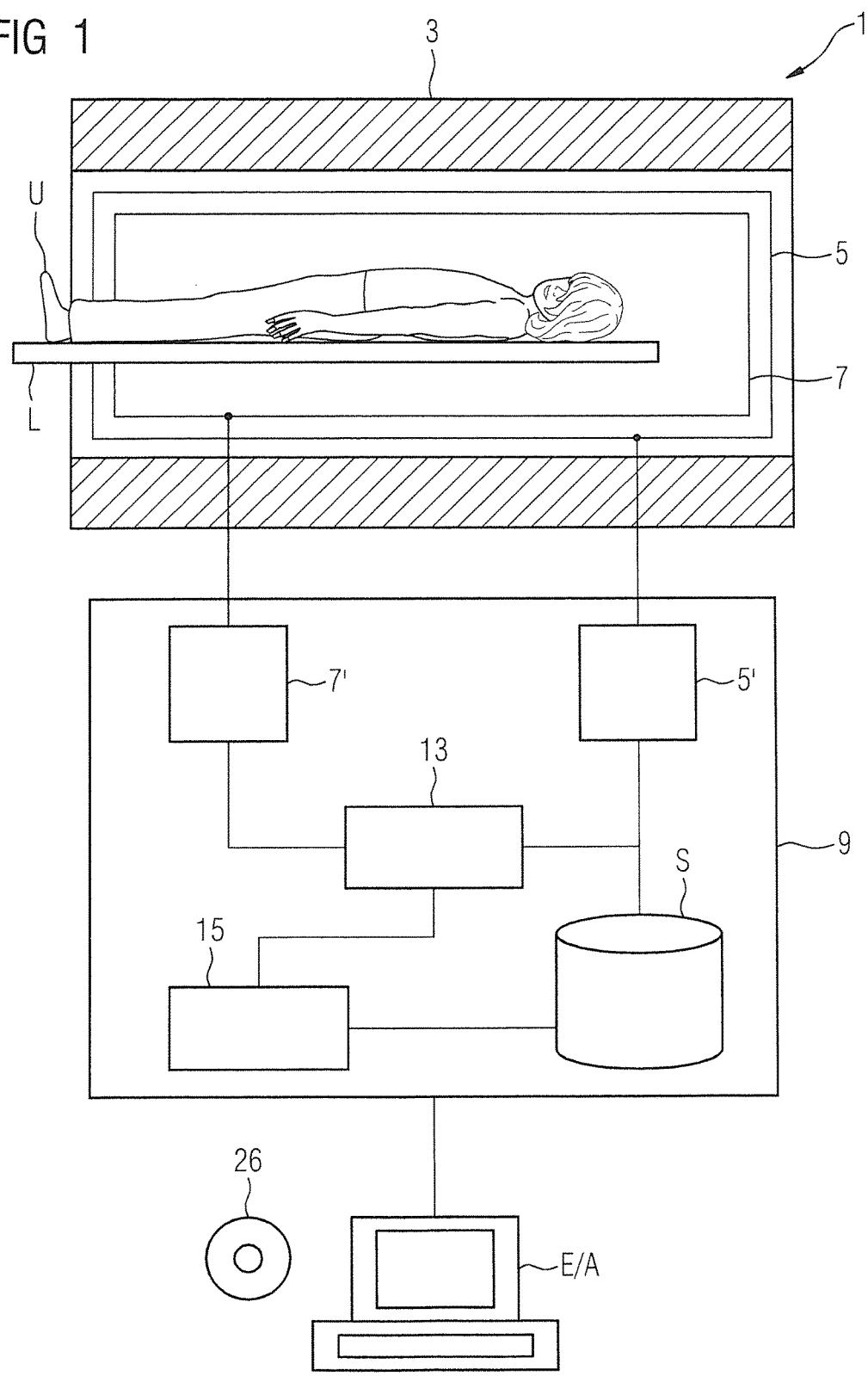
FIG. 1 is a schematic illustration of an inventive magnetic resonance system.

The FIG. 1 schematically illustrates an inventive magnetic resonance system having a magnetic resonance data acquisition scanner that has a basic field 1 a magnet 3 for generating the constant magnetic field, a gradient coil arrangement 5 for generating the gradient fields, a radio frequency antenna 7 for radiating and receiving radio frequency signals, and a control computer 9 designed for the performance of the inventive method. FIG. 1 schematically represents these subassemblies of the magnetic resonance system only roughly. For example, the radio frequency antenna 7 can be composed of several subunits, in particular several coils, which can be designed either only to transmit radio frequency signals or only to receive the triggered radio frequency signals, or for both.

To examine an examination object U, for example a patient or a phantom, the examination object U can be introduced on a couch L into the magnetic resonance scanner 1 in the measurement volume thereof.

The control computer 9 is configured to control the magnetic resonance scanner and controls the gradient coil arrangement 5 by a gradient controller 5' and controls the radio frequency antenna 7 by a radio frequency transmit/receive controller 7'. The control computer 9 further has an information determination processor 15 and is designed to perform the inventive method for the automatic assignment of at least one combination image of an examination object to a spin species represented in the combination image (see FIG. 2). A central processing unit 13 of the control computer 9 is designed to execute all processing operations needed for the requisite measurements and determinations. Interim results and results required for this purpose or determined in this connection can be stored in a memory S of the control computer 9. The components illustrated are not necessarily to be understood as physically separate units, but merely represent a subcategorization into coherent units, which can also be implemented in a few or in just one single physical unit.

Via an input/output interface E/A of the magnetic resonance system 1, it is possible for a user to enter control commands into the magnetic resonance system and/or to display results of the control computer 9 such as e.g. image data or the particular dephasing factors.

The steps described herein can be implemented individually or separately in the form of a computer program that implements the respective method in the control computer 9 when it is executed by the control computer 9. An electronically readable data carrier 26 with electronically readable control information stored thereon is loaded into the control computer 9 and the program code causes the control computer 9 to perform the method or methods described.

Figure 2:
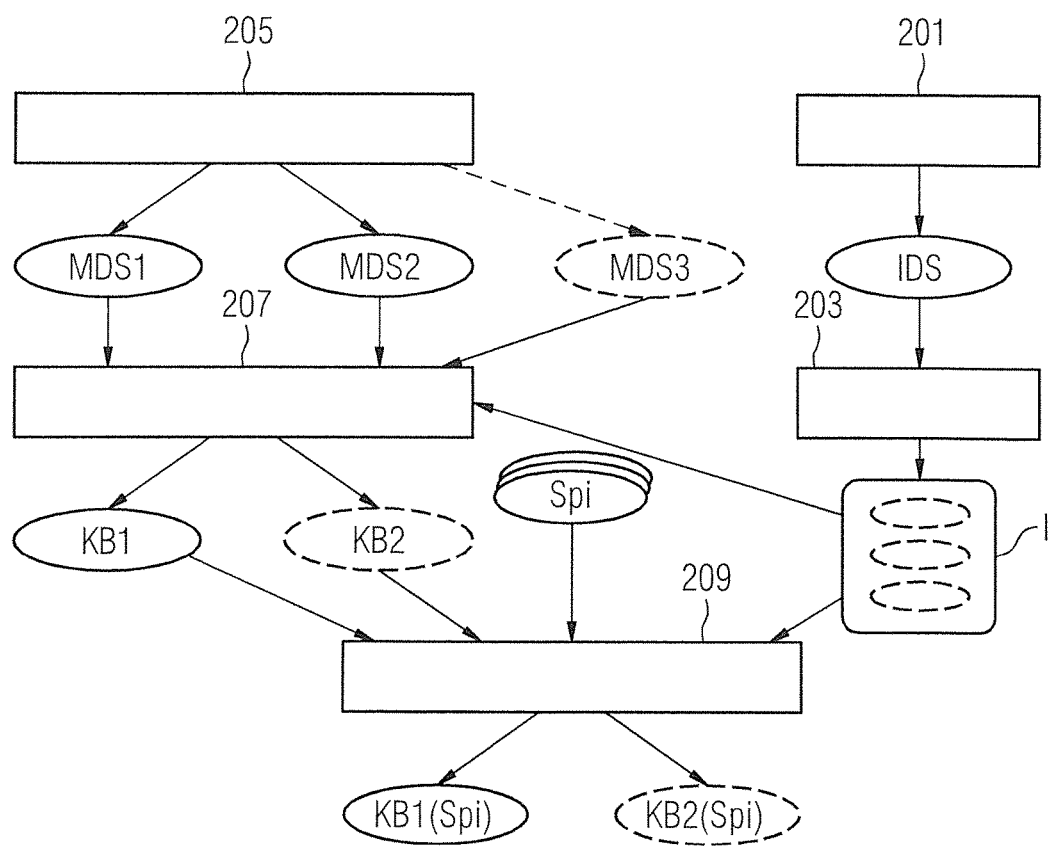
FIG. 2 is flowchart of an embodiment of the inventive method.

FIG. 2 is a flowchart of an embodiment the inventive method for the automatic assignment of at least one combination image of an examination object to a spin species represented in the combination image.

In a step 201 an information MR dataset IDS of the examination object is captured using the magnetic resonance system. The information MR dataset IDS can have a lower resolution than the at least two MR datasets MDS1, MDS2, MDS3. The information MR dataset IDS can in particular also be a so-called "adjustment scan" which is necessary in any case and permits adjustments needed for the subsequent measurements, such as e.g. frequency adjustment, or during use of multiple coils of the radio frequency unit also enables the coil sensitivities to be taken into consideration.

In a further step 203 information I about the examination object is determined from the captured information MR dataset IDS. The determined information I in particular contains information about the examination object which is suitable for drawing conclusions about which spin species present is the dominant spin species overall or at least locally.

The information determined from the information MR dataset IDS can be, for example, spectroscopic information. This can be obtained, for example, from a FID ("free induction decay") recorded by the information dataset. Spectra can be determined from the FID, which on the one hand can be further used to adjust the excitation frequencies to be used and on the other hand as spectroscopic information. In this or a similar manner information can also be obtained about a distribution of the resonance frequencies in the measured region of the examination object, it being possible to determine said information as information I from a corresponding information MR dataset IDS.

Additionally or alternatively, the information I obtained from the information MR dataset IDS can comprise a frequency distribution of the captured signal strengths ("magnitude"). Such frequency distributions can for example be present in the form of histograms. From the frequency distribution of the signal strengths the echo time dependency of the signals can be read off, for example.

Different spin species have different echo time dependencies. Hence this information can be used to perform a correct assignment of the spin species when the respective echo time dependencies of the different spin species are known.

Furthermore, the information I determined from the information MR dataset IDS can comprise coil sensitivity data, in particular if multiple coils of a radio frequency unit are used to capture the MR datasets. Thus differences in the signal strengths, which can be traced back to the different sensitivities of the coils used, can be taken into consideration.

Furthermore, in a step 205 at least two MR datasets MDS1, MDS2, MDS3 are captured at one of the at least two echo times in each case following an excitation, by a multi-contrast measurement using the magnetic resonance system.

Such a multi-contrast measurement can in particular be a Dixon measurement. If only two MR datasets MDS1, MDS2 are captured, in particular a two-point Dixon measurement. However, multi-point Dixon measurements are also conceivable for the inventive method, such as e.g. a three-point Dixon measurement. Accordingly more than only two sets of MR datasets MDS1, MDS2, MDS3 are captured, which are recorded at the respective more than only two echo times of the multi-point Dixon measurement.

At least one combination image KB1 is determined from the captured MR datasets MDS1, MDS2, MDS3 in one step. The procedure here can be in accordance with the standard methods for separation of signals of the various spin species, as was already mentioned in the introduction. Depending on the characteristics of the examination object and the desired combination image, two or more combination images KB1, KB2, . . . can also be determined. For example, in an examination object with more than two different spin species $Sp_i$ (i=1, 2, 3, . . . ), such as water, fat and silicone, a combination image $KB_j$, can be determined for each spin species $Sp_i$. However—as described above—it is not immediately apparent which combination image KB1, KB2, . . . should be assigned to which spin species.

In a step 209 the spin species Sp; that is actually represented in the combination image KB1 is automatically assigned to the at least one combination image KB1 on the basis of the information I determined from the information MR dataset IDS, so that it is known that the combination image KB1 for example represents the spin species $Sp_i$ ($KB1(Sp_i)$). If more than one combination image KB1, KB2 was determined, this assignment can be made on the basis of the information I for each combination image KB1, KB2 determined from the information MR dataset IDS.

The assignment is based on the determined information I. For example, the determined information I can be used to e.g. determine a local distribution of the spin species. From the determined local distribution it is possible to determine which spin species is dominant in which regions of the examination object. This information can in turn be compared, e.g. in the form of a mask, with the at least one combination image KB1, KB2. The comparison shows which combination image KB1, KB2 best matches the local distribution of which spin species. Said spin species is then assigned to the combination image KB1, KB2. The assignment of the spin species to a combination image KB1, KB2 thus takes place e.g. after a maximum possible correspondence of the local distribution to the regions represented in the combination image KB1, KB2 has been established.

As explained above, different types of information I are conceivable which permit identification of a locally dominant spin species, and in particular such information comprises spectroscopic information and/or frequency distributions of the signal strength.

The spatial resolution of the aforementioned determined local distribution need not correspond here to the resolution of the at least two MR datasets, and thus to the resolution of the at least one combination image, but can be selected to be lower.

It is likewise conceivable that, instead of determining a local distribution over the whole examination object on the basis of the spectroscopic information, the dominant spin species at just a few pixels, but at least one pixel, is identified and on the basis of the pixels established for one spin species the assignment of the full combination image KB1, KB2 takes place. This can be the case if e.g. two combination images KB1 and KB2 have been determined which have disjunct signals at least in corresponding subregions. This means that e.g. in one of the combination images no signal is displayed in a subregion, but in the other combination image a signal is shown in the corresponding subregion. Thus it is known that only one spin species is present in the subregion in question. It is thus sufficient in this case to identify the spin species for this subregion on the basis of the determined information I and to assign it to the combination image which displays a signal in the aforementioned subregion.

The assignments made can furthermore be stored e.g. in a memory S of a control device 9 of the magnetic resonance system or in any other memory. The assigned combination images KB1, KB2 can be displayed on a display unit indicating the represented, assigned spin species.

In an exemplary embodiment the information I determined from the information MR dataset IDS is also used in the context of determining the at least one combination image KB1 (step 207).

The determined information I can be used to prevent possibly locally occurring interchanges of the spin species identified as dominant or subordinate, as occur for example in an erroneous phase correction. In particular, so-called seed points could be determined from the spectroscopic information comprised in the information I, which assign pixels ambiguously to a spin species type (dominant or subordinate) in accordance with their spectroscopic content. Starting from such seed points surrounding pixels can likewise be assigned to a spin species type, e.g. by means of region-oriented methods ("region growing algorithms").

Spin species from the group water protons, fat protons, and silicone protons are suitable as globally assigned spin species $Sp_i$. The possible spin species $Sp_i$ are generally known beforehand, e.g. from the nature of the examination object.

Although modifications and changes may be suggested by those skilled in the art, it is the intention of the inventor to embody within the patent warranted hereon all changes and modifications as reasonably and properly come within the scope of his contribution to the art.

We claim as our invention:
1. A method for automatic assignment of at least one reconstructed magnetic resonance (MR) combination image of an examination object to a respective MR spins species, said method comprising:
generating control signals in a computer and providing the control signals from the computer to an MR scanner, and operating the MR scanner with said control signals to execute an informational scan of an examination object situated in the MR scanner, so as to acquire an informational MR dataset that represents object-specific information describing the examination object;

generating further control signals in said computer and providing the further control signals from the computer to the MR scanner, and operating the MR scanner with said further control signals to execute a multi-contrast diagnostic scan of the examination object, in which at least two echo times are produced following excitation of nuclear spins of at least two spins species, and in which at least two MR datasets are acquired respectively at said at least two echo times;

providing said at least two MR diagnostic datasets to said computer and, in said computer, reconstructing at least one MR combination image from said at least two MR diagnostic datasets, said at least one MR combination image depicting a contrast produced by one of said at least two spin species, but not having an image content that allows said one of said at least two spins species to be identified solely from said combination MR image;

also providing said informational dataset to said computer and, in said computer, deriving spin species-identifying information from said object-specific information in said informational dataset;

in said computer, applying said spin species-identifying information to said MR combination image so as to assign a spin species identified by said spin species-identifying information to said one of said at least two spin species depicted in said MR combination image; and in said computer, generating a data file containing said MR combination image and a designation of said one of said at least two spin species assigned thereto, and making said data file available from said computer in electronic form.

2. A method as claimed in claim 1 comprising determining said spin species-identifying information from said informational MR dataset selected from the group consisting of spectroscopic information, and information describing an existing distribution of resonance frequencies in the examination object.

3. A method as claimed in claim 1 comprising determining said spin species-identifying information from said information MR dataset as informational describing a frequency distribution in the examination object of the acquired signal strengths.

4. A method as claimed in claim 1 comprising also using said spin species-identifying information determined from the informational MR dataset in reconstructing said at least one combination image.

5. A method as claimed in claim 1 wherein said informational magnetic resonance dataset has a lower resolution than said at least two diagnostic MR datasets.

6. A method as claimed in claim 1 comprising assigning said respective spin species to said at least one combination image as a spin species selected from the group consisting of water protons, fat protons and silicon protons.

7. A magnetic resonance (MR) apparatus comprising:
an MR scanner;
a computer configured to generate control signals and provide the control signals from the computer to the MR scanner, and to operate the MR scanner with said control signals to execute an informational scan of an examination object situated in the MR scanner, so as to acquire an informational MR dataset that represents object-specific information describing the examination object;

said computer being configured to generate further control signals and provide the further control signals from the computer to the MR scanner, and to operate the MR scanner with said further control signals to execute a multi-contrast diagnostic scan of the examination object, in which at least two echo times are produced following excitation of nuclear spins of at least two spins species, and in which at least two MR datasets are acquired respectively at said at least two echo times;

said computer being provided with said at least two MR diagnostic datasets and said computer being configured to reconstruct at least one MR combination image from said at least two MR diagnostic datasets, said at least one MR combination image depicting a contrast produced by one of said at least two spin species, but not having an image content that allows said one of said at least two spins species to be identified solely from said combination MR image;

said computer also being provided with said informational dataset and said computer being configured to derive spin species-identifying information from said object-specific information in said informational dataset;

said computer being configured to apply said spin species-identifying information to said MR combination image so as to assign a spin species identified by said spin species-identifying information to said one of said at least two spin species depicted in said MR combination image; and said computer being configured to generate a data file containing said MR combination image and a designation of said one of said at least two spin species assigned thereto, and to make said data file available from said computer in electronic form.

8. A non-transitory, computer-readable data storage medium encoded with programming instructions, said storage medium being loaded into a computer of a magnetic resonance (MR) apparatus having an MR scanner, and said programming instructions causing said computer to:

generate control signals and provide the control signals from the computer to the MR scanner, and operate the MR scanner with said control signals to execute an informational scan of an examination object situated in the MR scanner, so as to acquire an informational MR dataset that represents object-specific information describing the examination object;

generate further control signals and provide the further control signals from the computer to the MR scanner, and operate the MR scanner with said further control signals to execute a multi-contrast diagnostic scan of the examination object, in which at least two echo times are produced following excitation of nuclear spins of at least two spins species, and in which at least two MR datasets are acquired respectively at said at least two echo times;

receive said at least two MR diagnostic datasets and reconstruct at least one MR combination image from said at least two MR diagnostic datasets, said at least one MR combination image depicting a contrast produced by one of said at least two spin species, but not having an image content that allows said one of said at least two spins species to be identified solely from said combination MR image;

also receive said informational dataset and derive spin species-identifying information from said object-specific information in said informational dataset;

apply said spin species-identifying information to said MR combination image so as to assign a spin species identified by said spin species-identifying information to said one of said at least two spin species depicted in said MR combination image; and generate a data file containing said MR combination image and a designation of said one of said at least two spin species assigned thereto, and make said data file available from said computer in electronic form.

* * * * *